(12) United States Patent
Ke et al.

(10) Patent No.: US 12,024,770 B2
(45) Date of Patent: Jul. 2, 2024

(54) METHODS FOR SELECTIVE DEPOSITION USING SELF-ASSEMBLED MONOLAYERS

(71) Applicant: APPLIED MATERIALS, INC., Santa Clara, CA (US)

(72) Inventors: Chang Ke, Sunnyvale, CA (US); Wenyu Zhang, San Jose, CA (US); Liqi Wu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 39 days.

(21) Appl. No.: 16/535,499

(22) Filed: Aug. 8, 2019

(65) Prior Publication Data

US 2020/0048762 A1 Feb. 13, 2020

Related U.S. Application Data

(60) Provisional application No. 62/717,452, filed on Aug. 10, 2018.

(51) Int. Cl.
*C23C 16/04* (2006.01)
*C23C 16/02* (2006.01)
(Continued)

(52) U.S. Cl.
CPC .......... *C23C 16/18* (2013.01); *C23C 16/0281* (2013.01); *C23C 16/04* (2013.01); *C23C 16/08* (2013.01); *C23C 16/45525* (2013.01)

(58) Field of Classification Search
CPC .............. C23C 16/04; C23C 16/45534; C23C 16/4404; C23C 16/45553; C23C 16/52; C23C 16/0236; C23C 16/0281; C23C 16/08; C23C 16/14; C23C 16/18; C23C 16/45525; C23C 16/06; C23C 16/0272; H01L 21/3105; H01L 21/32;
(Continued)

(56) References Cited

U.S. PATENT DOCUMENTS 6,235,645 B1 * 5/2001 Habuka ............. H01L 21/02046
134/2
7,045,170 B1 * 5/2006 Hankins ................. B82Y 30/00
427/255.11

(Continued)

FOREIGN PATENT DOCUMENTS

WO WO 2006/112408 A1 10/2006
WO WO-2016138284 A1 * 9/2016 ............. C23C 16/24

OTHER PUBLICATIONS

International Search Report and Written Opinion for PCT/US2019/045719, dated Nov. 29, 2019.

*Primary Examiner* — Katherine A Bareford
*Assistant Examiner* — Christina D McClure
(74) *Attorney, Agent, or Firm* — Moser Taboa (57) ABSTRACT

Methods and apparatus for selectively depositing a layer atop a substrate having a metal surface and a dielectric surface is disclosed, including: (a) contacting the metal surface with one or more metal halides such as metal chlorides or metal fluorides to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

18 Claims, 4 Drawing Sheets

(51) Int. Cl.
*C23C 16/08* (2006.01)
*C23C 16/18* (2006.01)
*C23C 16/455* (2006.01)

(58) Field of Classification Search
CPC .......... H01L 21/67017; H01L 21/6719; H01L 21/02211; H01L 21/0228; H01L 21/76826; H01L 21/76834; H01L 21/76883; H01L 21/02271; H01L 21/02312; H01L 21/28556; B05D 1/322; B05D 1/60; B05D 3/145
See application file for complete search history.

(56) References Cited

U.S. PATENT DOCUMENTS

| | | |
|---|---|---|
| 9,805,974 B1 | 10/2017 | Chen et al. |
| 2008/0038524 A1* | 2/2008 | Rajala ............... C03B 37/01838 427/532 |
| 2011/0198736 A1* | 8/2011 | Shero ................ C23C 16/45525 257/629 |
| 2016/0305020 A1* | 10/2016 | Wu ........................ B01D 1/14 |
| 2017/0037513 A1 | 2/2017 | Haukka et al. |
| 2017/0092533 A1 | 3/2017 | Chakraborty et al. |
| 2017/0256402 A1 | 9/2017 | Kaufman-Osborn et al. |
| 2017/0283934 A1* | 10/2017 | Fujikawa .................. C23C 8/80 |
| 2017/0342553 A1 | 11/2017 | Yu et al. |
| 2017/0350004 A1 | 12/2017 | Kaufman Osborn et al. |
| 2017/0352549 A1* | 12/2017 | Hendrix ............ H01L 21/31122 |
| 2018/0053659 A1 | 2/2018 | Chakraborty et al. |
| 2018/0096847 A1 | 4/2018 | Thompson et al. |
| 2018/0130657 A1 | 5/2018 | Duan et al. |
| 2018/0130671 A1 | 5/2018 | Duan et al. |
| 2018/0182597 A1* | 6/2018 | Blomberg ................ C23G 5/00 |

* cited by examiner

CONTACTING THE METAL SURFACE WITH ONE OR MORE METAL HALIDES TO FORM AN EXPOSED METAL SURFACE, WHEREIN THE EXPOSED METAL SURFACE INHIBITS DEPOSITION OF AN ORGANOSILANE BASED SELF-ASSEMBLED MONOLAYER THEREON

FIG. 4

METHODS FOR SELECTIVE DEPOSITION USING SELF-ASSEMBLED MONOLAYERS

CROSS-REFERENCE TO RELATED APPLICATIONS

This application claims priority benefit to U.S. Provisional Application No. 62/717,452 filed on Aug. 10, 2018 entitled Methods for Selective Deposition Using Self Assembled Monolayers (herein entirely incorporated by reference).

FIELD

Embodiments of the present disclosure generally relate to methods for selective deposition using self-assembled monolayers.

BACKGROUND

Selective atomic layer deposition (ALD) and chemical vapor deposition (CVD) processes can advantageously reduce the number of steps and cost involved in conventional lithography while keeping up with the pace of device dimension shrinkage. Selective deposition in a metal dielectric pattern is of high potential value in back-end of line (BEOL) applications. Some alternative selective silicon based dielectric deposition techniques that have emerged are template-controlled growth, holographic based lithography, and the like. However, none of these alternative techniques provide a complete solution due to limitations relating to metal oxide formation under atmospheric conditions. The inventors have observed the nature of metal raises a severe challenge, e.g., the existence of native oxide on the metal surface. Because the metal oxides may act as dielectrics, the thin layer of native oxide makes the metal surface indistinguishable from dielectric surface for self-assembled monolayer (SAM) resulting in diminished selectivity or selectivity loss.

Accordingly, the inventors have developed improved methods and apparatus for selective dielectric deposition using self-assembled monolayer as sacrificial and nucleation inhibition layer.

SUMMARY

Methods and apparatus for selective deposition are provided herein. In some embodiments, an method includes selectively depositing a layer atop a substrate having a metal surface and a dielectric surface, including: (a) contacting the metal surface with one or more metal halides to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface. In embodiments, the metal halide is a metal chloride, metal fluoride, alkaline metal chloride, or combinations thereof.

In another embodiment, a method of conditioning a substrate having a metal surface and a dielectric surface, is provided including contacting the metal surface with one or more metal halides to form an exposed metal surface, wherein the exposed metal surface inhibits deposition of an organosilane based self-assembled monolayer thereon. In embodiments, the metal halide is a metal chloride, metal fluoride, alkaline metal chloride, or combinations thereof.

In some embodiments, an method includes selectively depositing a layer atop a substrate having a metal surface and a dielectric surface, including: (a) contacting the metal surface with one or more metal chlorides, metal fluorides, or combinations thereof to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

In some embodiments, the present disclosure relates to a computer readable medium, having instructions stored thereon which, when executed, cause a process chamber to perform a method of selectively depositing a layer atop a substrate having a metal surface and a dielectric surface including: (a) contacting the metal surface with one or more metal halides to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for selective deposition using self-assembled monolayer (SAM) are provided herein. In some embodiments, the methods described herein advantageously condition a substrate having a metal surface and a dielectric surface by contacting the metal surface with one or more metal halides such as metal chlorides, metal fluorides and the like to form an exposed metal surface, wherein the exposed metal surface inhibits deposition of an organosilane based self-assembled monolayer thereon. The exposed metal surface advantageously does not include a problematic oxide layer which may promote deposition of an organosilane based self-assembled monolayer thereon and limit or destroy the selectivity of the process.

Figure 1:
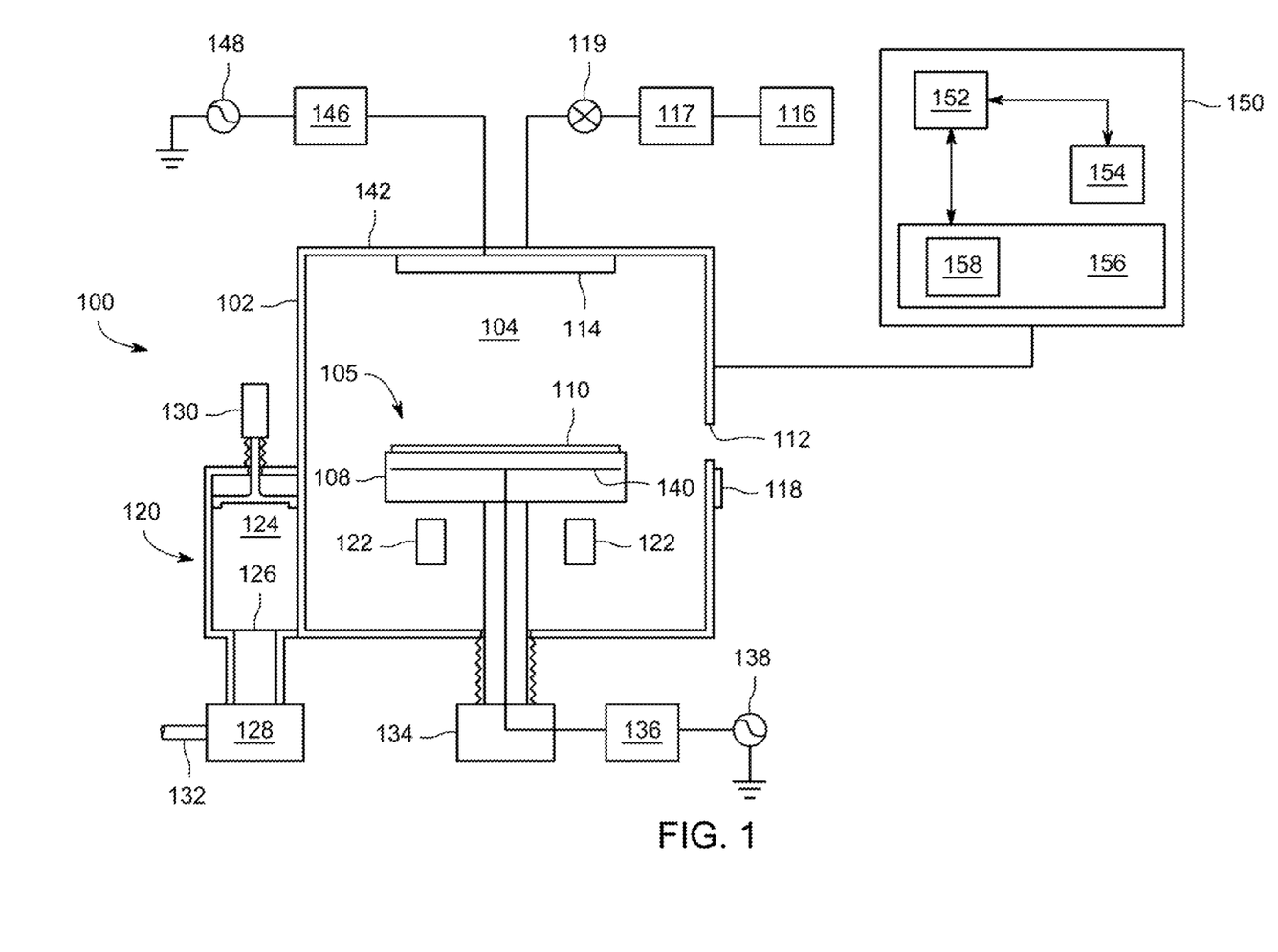
FIG. 1 is a process chamber suitable for performing a chemical vapor deposition process or atomic layer deposition process in accordance with some embodiments of the present disclosure.
Figure 2:
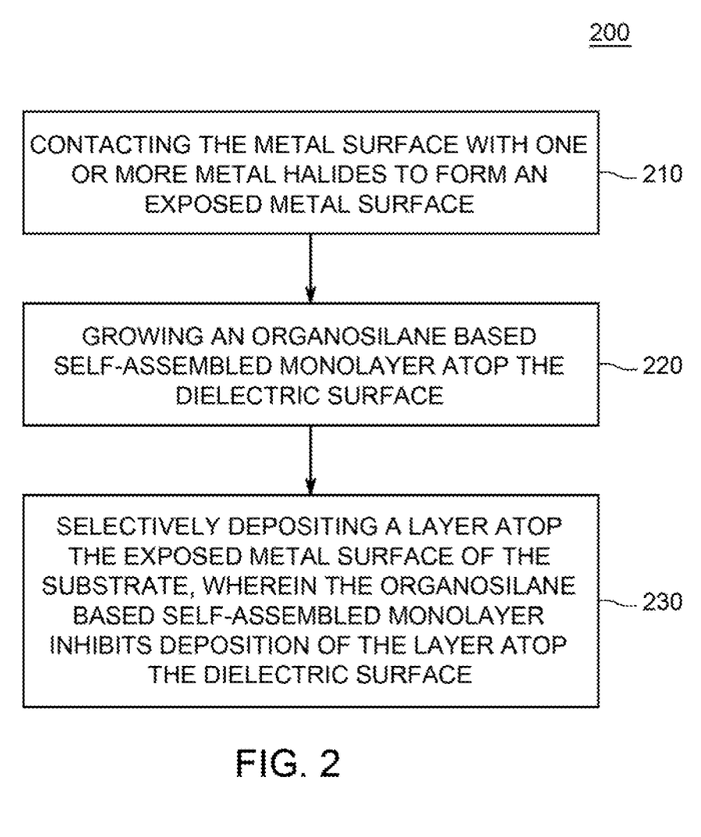
FIG. 2 is a flowchart of a method of selective deposition in accordance with some embodiments of the present disclosure.

FIG. 2 is a flow diagram of a method 200 of processing a substrate having a metal surface and a dielectric surface in accordance with some embodiments of the present disclosure. FIGS. 3A-3E are illustrative cross-sectional views of the substrate during different stages of the processing sequence of FIG. 2 in accordance with some embodiments of the present disclosure. The methods of the present disclosure may be performed in process chambers configured for atomic layer deposition (ALD) or chemical vapor deposition (CVD), such as the process chamber discussed below with respect to FIG. 1.

Figure 3A:
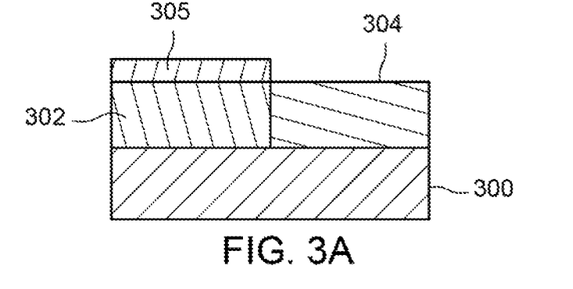
FIGS. 3A-3E are illustrative cross-sectional views of the substrate during different stages of the processing sequence of FIG. 2 in accordance with some embodiments of the present disclosure.

The method 200 is performed on a substrate 300, as depicted in FIG. 3A, having a metal surface 302 and a dielectric surface 304. In embodiments, substrate 300 may comprise a material such as crystalline silicon (e.g., Si<100> or Si<111>), silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, and combinations thereof. In embodiments, the substrate 300 may have various dimensions, such as 200 mm, 300 mm, 450 mm or other diameters for round substrates. The substrate 300 may also be any polygonal, square, rectangular, curved or otherwise non-circular workpiece, such as a polygonal glass substrate used in the fabrication of flat panel displays. Unless otherwise noted, implementations and examples described herein are conducted on substrates such as substrate 300 with a 200 mm diameter, a 300 mm diameter, or a 450 mm diameter substrate.

In embodiments, dielectric surface 304 is not the same as metal surface 302. In some embodiments, the dielectric surface 304 is deposited via any suitable atomic layer deposition process or a chemical layer deposition process. In some embodiments, the dielectric surface 304 may comprise a low-k dielectric layer deposited atop substrate 300. In some embodiments, dielectric surface 304 may include any low-k dielectric material suitable for semiconductor device fabrication. Non-limiting materials suitable as low-k dielectric material may comprise a silicon containing material, for example, such as silicon oxide (SiO2), silicon nitride, or silicon oxynitride (SiON). In embodiments, the low-k dielectric material may have a low-k value of less than about 3.9 (for example, about 2.5 to about 3.5). In some embodiments, the dielectric surface 304 may comprise hafnium oxide such as $HfO_x$.

In some embodiments, metal surface 302 is deposited via any suitable atomic layer deposition process or a chemical layer deposition process. In some embodiments, the metal surface 302 may comprise any metal suitable for semiconductor device fabrication. Non-limiting metal suitable for metal surface 302 comprise copper (Cu), cobalt (Co), tungsten (W), niobium (Nb), ruthenium (Ru), or molybdenum (Mo), and combinations thereof such as alloys and the like. Referring to FIG. 3A, a metal oxide layer 305 is shown disposed atop metal surface 302. Metal oxide layer 305 may be a native oxide layer or form as metal surface 302 contacts oxygen, for example in air or water. Metal oxide layer 305 is problematic in that the metal oxide layer 305 act as a dielectric layer or promotes deposition of an organosilane based self-assembled monolayer thereon. The formation of organosilane based self-assembled monolayer atop metal oxide layer 305 and metal surface 302 may inhibit or decrease the selectivity of a selective deposition method. In embodiments, the metal oxide layer 305 is removed prior to depositing the self-assembled monolayer 306.

Figure 3B:
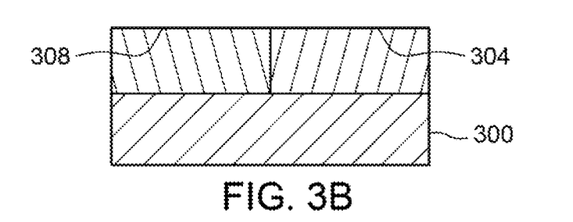

In accordance with the present disclosure, the method 200 begins at 210 and as depicted in FIGS. 3A and 3B, by contacting the metal surface with one or more metal halides such as metal chlorides or metal fluorides and the like to form an exposed metal surface 308. By selecting one or more metal halides such as metal chlorides or metal fluorides, exposed metal surface 308 is formed free, or substantially free of metal oxide layer 305, and exposed metal surface 308 is unavailable for self-assembled monolayer (SAM) bonding thereto. Non-limiting examples of exposed metal surface material includes substantially pure, for example, substantially free of oxide, copper (Cu), cobalt (Co), tungsten (W), Niobium (Nb), ruthenium (Ru), or molybdenum (Mo), and combinations thereof such as alloys and the like.

In embodiments, the one or more metal halides such as metal chlorides or metal fluorides contact metal surface 302 in an amount sufficient to remove metal oxide layer 305. For example, the one or more metal halides such as metal chlorides or metal fluorides may etch the metal oxide layer 305 atop metal surface 302 to form an exposed metal surface 308 as shown in FIG. 3B. In embodiments, contacting the metal surface 302 with one or more metal halides such as metal chlorides or metal fluorides is performed using an amount of the one or more metal halides such as metal chlorides or metal fluorides sufficient to remove metal oxide layer 305, under conditions suitable for the reaction. In embodiments, contacting the metal surface 302 with one or more metal halides such as metal chlorides or metal fluorides is performed at a first temperature of about 300 to about 400 degrees Celsius, or about 325 to about 375 degrees Celsius, or about 325 degrees Celsius, about 350 degrees Celsius, or about 375 degrees Celsius. In embodiments, contacting the metal surface 302 with one or more metal halides such as metal chlorides or metal fluorides is performed at a pressure in an amount of 1 to 15 Torr, about 1 to about 15 Torr, about 5 Torr, about 10 Torr, or about 15 Torr. In embodiments, contacting the metal surface 302 with one or more metal halides such as metal chlorides or metal fluorides is performed for about 5 to about 20 minutes, such as about 10 minutes to about 15 minutes. In embodiments, contacting the metal surface with one or more metal halides such as metal chlorides or metal fluorides is performed for 5 to 20 minutes.

In some embodiments, one or more alkali metal halides contact metal surface 302 in an amount sufficient to remove metal oxide layer 305. For example, the one or more alkali metal halides may etch the metal oxide layer 305 atop metal surface 302 to form an exposed metal surface 308 as shown in FIG. 3B. In embodiments, contacting the metal surface 302 with one or more alkali metal halides is performed using an amount of the one or more alkali metal halides sufficient to remove metal oxide layer 305, under conditions suitable for the reaction. In embodiments, contacting the metal surface 302 with one or more alkali metal halides is performed at a first temperature of about 300 to about 400 degrees Celsius, or about 325 to about 375 degrees Celsius, or about 325 degrees Celsius, about 350 degrees Celsius, or about 375 degrees Celsius. In embodiments, contacting the metal surface 302 with one or more alkali metal halides is performed at a pressure in an amount of 1 to 15 Torr, about 1 to about 15 Torr, about 5 Torr, about 10 Torr, or about 15 Torr. In embodiments, contacting the metal surface 302 with one or more alkali metal halides is performed for about 5 to about 20 minutes, such as about 10 minutes to about 15 minutes. In embodiments, contacting the metal surface with one or more alkali metal halides is performed for 5 to 20 minutes. Non-limiting examples of alkali metal halides include alkali metal fluorides, alkali metal chlorides, alkali metal bromides, alkali metal iodides, lithium halides, sodium halides, potassium halides, rubidium halides, caesium halides, and combinations thereof. Examples of alkali metal fluorides include lithium fluoride, sodium fluoride, potassium fluoride, rubidium fluoride, caesium fluoride and combinations thereof. Examples of alkali metal chlorides include lithium chloride, sodium chloride, potassium chloride, rubidium chloride, caesium chloride, and combinations thereof. Examples of alkali metal chlorides include lithium chloride, sodium chloride, potassium chloride, rubidium chloride, caesium chloride, and combinations thereof.

In embodiments, the one or more metal halides contact metal surface 302 in an amount sufficient to remove metal oxide layer 305. For example, the one or more metal halides may etch the metal oxide layer 305 atop metal surface 302 to form an exposed metal surface 308 as shown in FIG. 3B. In embodiments, contacting the metal surface 302 with one or more metal halides is performed using an amount of the one or more metal halides sufficient to remove metal oxide layer 305, under conditions suitable for the reaction. In embodiments, contacting the metal surface 302 with one or more metal halides is performed at a first temperature of about 300 to about 400 degrees Celsius, or about 325 to about 375 degrees Celsius, or about 325 degrees Celsius, about 350 degrees Celsius, or about 375 degrees Celsius. In embodiments, contacting the metal surface 302 with one or more metal halides is performed at a pressure in an amount of 1 to 15 Torr, about 1 to about 15 Torr, about 5 Torr, about 10 Torr, or about 15 Torr. In embodiments, contacting the metal surface 302 with one or more metal halides is performed for about 5 to about 20 minutes, such as about 10 minutes to about 15 minutes. In embodiments, contacting the metal surface with one or more metal halides is performed for 5 to 20 minutes. Examples of metal halides include metal fluorides, metal chlorides, metal bromides, metal iodides, and combinations thereof. Non-limiting examples of suitable one or more metal chlorides for use in accordance with the present disclosure include WClx, NbClx, RuClx, MoClx, and combinations thereof, wherein x is an integer or number.

In embodiments, contacting the metal surface 302 with one or more metal halides such as metal chloride or metal fluoride is performed under vacuum, such that oxygen is not available to inhibit the reaction or promote the growth of additional metal oxide material atop metal surface 302. In embodiments, contacting the metal surface 302 with one or more one or more metal halides such as metal chloride or metal fluoride is performed in a chamber such as the process chamber of FIG. 1. The process chamber of FIG. 1 may be oxygen-free.

Metal chlorides suitable for use in accordance with the present disclosure include any metal chloride suitable to sufficiently remove metal oxide layer 305 atop metal surface 302 to form exposed metal surface 308. Non-limiting examples of suitable one or more alkali metal chlorides for use in accordance with the present disclosure include WClx, NbClx, RuClx, MoClx, or combinations thereof, wherein x is an integer or number. In embodiments, tungsten chloride (WClx), wherein x is an integer, such as greater than 1 is provided in a gaseous form. In embodiments, WClx is a suitable reactant (where x is an integer such as 2, 4, 5, 6, . . . ). In one embodiments, WClx is $WCl_6$ (tungsten hexachloride), where x is the integer 6. In some embodiment, a precursor gas includes $WCl_5$ or $WCl_6$. In embodiments, RuCix where X is an integer of 2 or 3 is suitable for use herein, for example ruthenium (III) chloride, or ruthenium chloride ($RuCl_2$). In embodiments, niobium chloride such as NbClx (x=5, 4) is suitable for use herein. In embodiments, the metal chloride suitable for use herein may be provided in a gaseous form such as a precursor gas suitable for delivery to substrate in a chamber such as the process chamber of FIG. 1. In embodiments, the process chamber of FIG. 1 is an oxygen-free chamber.

One example of reaction formulas for metal chlorides reacting with metal surface 302 is shown below:

In the above reaction, gas phase WCl, etches away native oxide and leaves pure metal on the surface, to form the exposed metal surface.

Another example of reaction formulas for metal chlorides reacting with metal surface 302 is shown below:

In the above reaction, hydrogen gas is added together with WClx. As a result, the native oxide is removed. Other reactions may be suitable for use in accordance with the present disclosure, including reactions that deposit an additional layer of metal such as tungsten (W) on the exposed metal surface area.

Figure 3C:
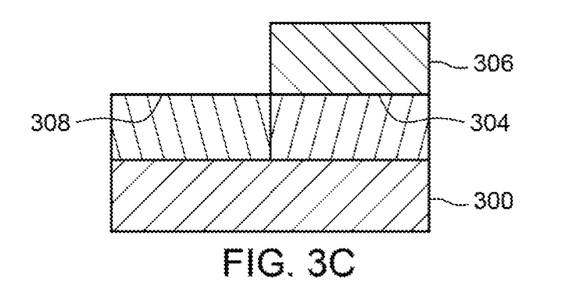

The method 200 continues at 220 and as depicted in FIG. 3C, by growing or depositing self-assembled monolayer 306, such as an organosilane based self-assembled monolayer, atop the dielectric surface 304. In embodiments, the self-assembled monolayer 306 may be chosen to be thermally stable at a first temperature of greater than about 50 degrees Celsius, for example about 100 to about 500 degrees Celsius. By selecting a self-assembled monolayer 306 that is thermally stable at the first temperature, the deposition of the self-assembled monolayer 306, via a chemical vapor deposition (CVD) or atomic layer deposition (ALD) process, may be performed at a temperature of less than 300 degrees Celsius, such as about 100 degrees Celsius to about 200 degrees Celsius and will not decompose the self-assembled monolayer 306.

In embodiments, growing or depositing a self-assembled monolayer 306 such as organosilane based self-assembled monolayer atop the dielectric surface 304 includes contacting the dielectric surface 304 with organosilane. In embodiments, the organosilane is in the gaseous form and delivered in a chamber under vacuum. Suitable organosilanes have long alkyl chains to form a compact, defect free, thermally stable, and chemically inert barrier which can be removed cleanly at a later stage. Suitable organosilanes may comprise C-8 to C-30 alkyl chains, including all the corresponding homologues with C-8 to upward of C-30 alkyl chains. Exemplary suitable organosilanes include, but are not limited to, octadecyltrichlorosilane (ODTS), trimethoxy(octadecyl)silane (ODTMS), chloro(dimethyl)octadecylsilane (CDODS), or trichloro(1H, 1H, 2H, 2H-perfluorooctyl)silane (PFTS). One of the criteria mentioned above of choosing the organosilane molecule may be the thermal stability of the self-assembled monolayer. In embodiments, selecting a self-assembled monolayer that is thermally stable at the deposition temperature of the subsequently deposited layer 310 avoids decomposition of the self-assembled monolayer 306 at the deposition temperature of the subsequently deposited layer. For example, the thermal stability of ODTS on silicon dioxide (SiO2) is at least up to 500 degree Celsius. Accordingly, an ODTS self-assembled monolayer will not decompose during the deposition of layer 310 via an ALD process. Thus, the thermal stability of SAM expands the temperature compatibility limit. In embodiments, growing the organosilane based self-assembled monolayer is performed at a pressure in an amount of 10 to 250 Torr, 100 to 350 Torr, or 250 to 350 Torr.

In some embodiments, non-limiting examples of suitable organoaminosilanes may include silylamine materials including those described in U.S. patent application Ser. No. 15/446,816 entitled Self-Assembled Monolayer Blocking with Intermittent Air-Water Exposure to Kaufman-Osborn et al.

In some embodiments, non-limiting examples of silylamine materials suitable for use as a SAM precursor herein include tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, tris(dimethylamino)nonadecylsilane, and combinations thereof.

In some embodiments, non-limiting examples of SAM molecules for use herein include: dimethylaminotrimethysilane, and chemicals with the following formulations:

or and combinations thereof.

In some embodiments, the organosilane based self-assembled monolayer is provided in a gas precursor form and may include for example a concentration of organosilane sufficient to form a monolayer upon dielectric surface 304 sufficient to block the deposition of layer 310 thereon. In embodiments, the substrate 300 having an exposed metal surface 308 and a dielectric surface 304 is contacted with a gaseous precursor material comprising organosilane for about 2 to about 3 hours to form the self-assembled monolayer 306 atop the dielectric surface 304. The organosilane molecules have a chemical affinity (e.g. are reactive and selective) to the dielectric surface 304. Thus, the self-assembled monolayer 306 will only form on the dielectric surface 304 but not on the exposed metal surface 308. In embodiments, the substrate 300 stays or remains under vacuum, after depositing the self-assembled monolayer 306 to remove any unabsorbed organosilane molecules.

Figure 3D:
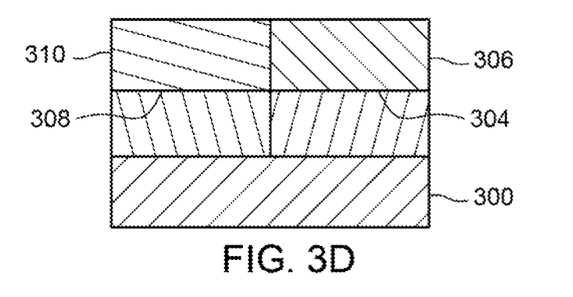

Next, at 230 and as depicted in FIG. 3D, selectively depositing a layer 310 atop the exposed metal surface 308 of the substrate 300 is shown, wherein the self-assembled monolayer 306 such as an organosilane based self-assembled monolayer inhibits deposition of the layer 310 atop the dielectric surface 304. FIG. 3D shows a layer 310 is selectively depositing atop the exposed metal surface 308 of the substrate 300. In some embodiments, the layer is deposited via any suitable atomic layer deposition process or a chemical layer deposition process. The presence of the self-assembled monolayer 306 atop the dielectric surface 304 inhibits formation of the layer 310 on the dielectric surface 304. In embodiments, the thermal stability of the self-assembled monolayer 306 prevents decomposition of the self-assembled monolayer 306 at the deposition temperatures of the layer 310 (e.g. less than about 300 degrees Celsius). The layer 310 may include any material suitable for semiconductor device fabrication. For example, in some embodiments, material may be a second low-k material or be a silicon containing material, for example, such as silicon oxide (SiO2).

Figure 3E:
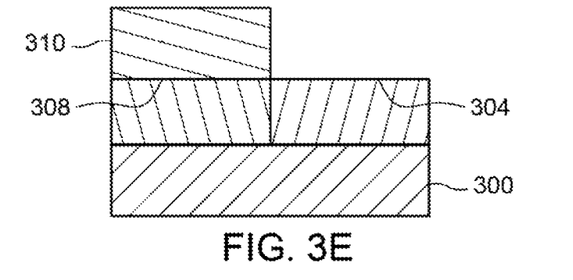

Next, and as depicted in FIG. 3E, the substrate 300 is treated to remove the self-assembled monolayer 306 from atop the dielectric surface 304. For example, the substrate 300 may be contacted with a remote plasma to remove self-assembled monolayer 306 from atop the dielectric surface 304. In some embodiments other removal processes may include contacting the substrate with water vapor plasma to remove self-assembled monolayer 306 from atop the dielectric surface 304. In some embodiments, substrate 300 may be heated to a temperature of greater than about 500 degrees Celsius, for example about 500 to about 1000 degrees Celsius, to remove the self-assembled monolayer 306 from atop the dielectric surface 304. Embodiments may include heating the substrate to a temperature above 500 degrees Celsius. Following removal of the self-assembled monolayer 306 the method 200 ends and the substrate may undergo further processing as necessary for completion of a semiconductor device, such as a field effect transistor (FET), a fin field effect transistor (FinFET), a flash memory device, a 3D FINFET device, or the like.

Figure 4:
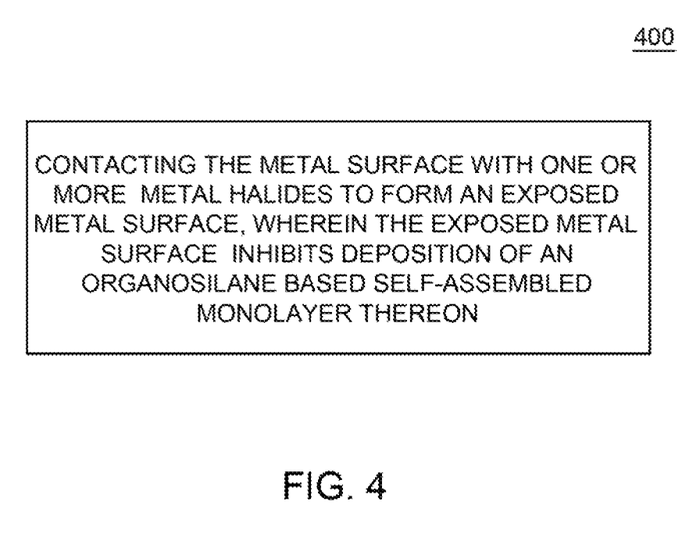
FIG. 4 is a flow diagram of a method of conditioning a substrate having a metal surface and a dielectric surface in accordance with some embodiments of the present disclosure.

FIG. 4 depicts is a flow diagram 400 of a method of conditioning a substrate having a metal surface and a dielectric surface in accordance with some embodiments of the present disclosure. In embodiments, a method of conditioning a substrate having a metal surface and a dielectric surface is provided. In embodiments, the methods may include contacting the metal surface with one or more metal halides such as metal chloride or metal fluoride to form an exposed metal surface, wherein the exposed metal surface inhibits deposition of an organosilane based self-assembled monolayer thereon. In some embodiments, contacting the metal surface with one or more one or more metal halides such as metal chloride or metal fluoride is performed at a first temperature of about 300 to about 400 degrees Celsius, at a pressure in the amount of 1 to 15 Torr, for a duration of 5 to 20 minutes. In embodiments, the metal chloride is a gas comprising WClx, NbClx, RuClx, MoClx, or combinations thereof, wherein x is an integer or number. In other embodiments, the contacting the metal surface with one or more metal chlorides, metal fluorides, or combinations thereof is performed under any of the conditions described above. In embodiments, the one or more metal halides is a metal chloride gas comprising WClx, NbClx, RuClx, MoClx, or combinations thereof, wherein x is an integer or number.

FIG. 1 depicts a schematic diagram of an illustrative apparatus of the kind that may be used to practice embodiments of the disclosure as discussed herein. The apparatus 100 may comprise a controller 150 and a process chamber 102 having an exhaust system 120 for removing excess process gases, processing by-products, or the like, from the inner volume 105 of the process chamber 102. Exemplary process chambers may include any of several process chambers configured for atomic layer deposition (ALD) or chemical vapor deposition (CVD), available from Applied Materials, Inc. of Santa Clara, California Other suitable process chambers from other manufacturers may similarly be used.

The process chamber 102 has an inner volume 105 that may include a processing volume 104. The processing volume 104 may be defined, for example, between a substrate support 108 disposed within the process chamber 102 for supporting a substrate 110 thereupon during processing and one or more gas inlets, such as a showerhead 114 and/or nozzles provided at predetermined locations. In some embodiments, the substrate support 108 may include a mechanism that retains or supports the substrate 110 on the surface of the substrate support 108, such as an electrostatic chuck, a vacuum chuck, a substrate retaining clamp, or the like (not shown). In some embodiments, the substrate support 108 may include mechanisms for controlling the substrate temperature (such as heating and/or cooling devices, not shown) and/or for controlling the species flux and/or ion energy proximate the substrate surface.

For example, in some embodiments, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 140 at respective frequencies of about 2 MHz and about 13.56 MHz. The at least one bias power source may provide either continuous or pulsed power. In some embodiments, the bias power source alternatively may be a DC or pulsed DC source.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process. When in at least one of the elevated processing positions, the substrate support 108 may be disposed above the opening 112 to provide a symmetrical processing region.

The one or more gas inlets (e.g., the showerhead 114) may be coupled to a gas supply 116 for providing one or more process gases through a mass flow controller 117 into the processing volume 104 of the process chamber 102. In addition, one or more valves 119 may be provided to control the flow of the one or more process gases. The mass flow controller 117 and one or more valves 119 may be used individually, or in conjunction to provide the process gases at predetermined flow rates at a constant flow rate, or pulsed (as described above).

Although a showerhead 114 is shown in FIG. 1, additional or alternative gas inlets may be provided such as nozzles or inlets disposed in the ceiling or on the sidewalls of the process chamber 102 or at other locations suitable for providing gases to the process chamber 102, such as the base of the process chamber, the periphery of the substrate support, or the like.

The apparatus 100 may utilize capacitively coupled RF energy for plasma processing. For example, the process chamber 102 may have a ceiling 142 made from dielectric materials and a showerhead 114 that is at least partially conductive to provide an RF electrode (or a separate RF electrode may be provided). The showerhead 114 (or other RF electrode) may be coupled to one or more RF power sources (one RF power source 148 shown) through one or more respective matching networks (matching network 146 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 120 generally includes a pumping plenum 124 and one or more conduits that couple the pumping plenum 124 to the inner volume 105 (and generally, the processing volume 104) of the process chamber 102.

A vacuum pump 128 may be coupled to the pumping plenum 124 via a pumping port 126 for pumping out the exhaust gases from the process chamber via one or more exhaust ports (two exhaust ports 122 shown). The vacuum pump 128 may be fluidly coupled to an exhaust outlet 132 for routing the exhaust to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

To facilitate control of the process chamber 102 as described above, the controller 150 may be any form of general-purpose computer processor that can be used in an industrial setting for controlling various chambers and subprocessors.

The memory, or computer-readable medium, 156 of the CPU 152 may be one or more of readily available memory such as random access memory (RAM), read only memory (ROM), floppy disk, hard disk, or any other form of digital storage, local or remote. The support circuits 154 are coupled to the CPU 152 for supporting the processor in a conventional manner. These circuits include cache, power supplies, clock circuits, input/output circuitry and subsystems, and the like.

The methods disclosed herein may generally be stored in the memory 156 as a software routine 158 that, when executed by the CPU 152, causes the process chamber 102 to perform processes of the present disclosure. The software routine 158 may also be stored and/or executed by a second CPU (not shown) that is remotely located from the hardware being controlled by the CPU 152. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 158 may be executed after the substrate 110 is positioned on the substrate support 108. The software routine 158, when executed by the CPU 152, transforms the general purpose computer into a specific purpose computer (controller 150) that controls the chamber operation such that the methods disclosed herein are performed.

In some embodiments, the present disclosure relates to a process chamber configured for performing a method of selectively depositing a layer atop a substrate having a metal surface and a dielectric surface including: (a) contacting the metal surface with one or more metal halides to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

In some embodiments, the present disclosure relates to a computer readable medium, having instructions stored thereon which, when executed, cause a process chamber to perform a method of selectively depositing a layer atop a substrate having a metal surface and a dielectric surface including: (a) contacting the metal surface with one or more metal halides to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

In some embodiments, the present disclosure relates to a computer readable medium, having instructions stored thereon which, when executed, cause a method of conditioning a substrate having a metal surface and a dielectric surface, including: contacting the metal surface with one or more metal halides to form an exposed metal surface, wherein the exposed metal surface inhibits deposition of an organosilane based self-assembled monolayer thereon.

In some embodiments, the present disclosure relates to a computer readable medium, having instructions stored thereon which, when executed, cause a method of selectively depositing a layer atop a substrate having a metal surface and a dielectric surface, including: (a) contacting the metal surface with one or more metal chlorides, metal fluorides, or combinations thereof to form an exposed metal surface; (b) growing an organosilane based self-assembled monolayer atop the dielectric surface; and (c) selectively depositing a layer atop the exposed metal surface of the substrate, wherein the organosilane based self-assembled monolayer inhibits deposition of the layer atop the dielectric surface.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of selectively depositing a layer atop a substrate having a metal surface comprising copper, cobalt, tungsten, or molybdenum, or combination thereof and an adjacent dielectric surface, consisting essentially of:
   (a) during a semiconductor device fabrication comprising atomic layer deposition or chemical vapor deposition process, contacting the metal surface with, concurrently, one or more metal halides to convert a metal component of a surface metal oxide to volatile metal halide to form an exposed metal surface at a pressure in an amount of 1 to 15 Torr, at a first temperature of about 300 to about 400 degrees Celsius, wherein the one or more metal halides is a metal chloride comprising $WCl_x$, $MoCl_x$, or combinations thereof, wherein x is an integer, wherein forming the exposed metal surface consists of said contacting with metal halides, or said contacting with metal halides and contacting with diatomic hydrogen gas;
   (b) growing an organosilane based self-assembled monolayer atop the dielectric surface; and
   (c) selectively depositing a layer atop the exposed metal surface of the substrate, wherein the organosilane based self-assembled monolayer inhibits deposition of the layer atop the dielectric surface.

2. The method of claim 1, wherein contacting the metal surface with one or more metal halides is performed at the first temperature of about 325 to about 375 degrees Celsius.

3. The method of claim 2, wherein contacting the metal surface with one or more metal halides is performed together with further contacting the metal surface with hydrogen.

4. The method of claim 3, wherein contacting the metal surface with one or more metal halides is performed for 5 to 20 minutes.

5. The method of claim 1, wherein the one or more metal halides is a gas.

6. The method of claim 1, wherein the contacting the metal surface with one or more metal halides is performed in an oxygen-free chamber.

7. The method of claim 1, wherein contacting the metal surface with one or more metal halides forms an exposed metal surface atop the metal surface.

8. The method of claim 1, wherein growing the organosilane based self-assembled monolayer comprises exposing the substrate to a gas comprising an organosilane.

9. The method of claim 1, wherein the organosilane based self-assembled monolayer comprises a C-8 to C-30 alkyl chain.

10. The method of claim 1, wherein growing the organosilane based self-assembled monolayer is performed at a first temperature of about 100 to about 200 degrees Celsius.

11. The method of claim 1, wherein growing the organosilane based self-assembled monolayer is performed at a pressure in an amount of 10 to 350 Torr.

12. The method of claim 1, wherein growing the organosilane based self-assembled monolayer is performed for a duration of about 2 to about 3 hours.

13. The method of claim 1, wherein growing the organosilane based self-assembled monolayer is performed in an oxygen-free chamber.

14. The method of claim 1, wherein the organosilane based self-assembled monolayer comprises tris(dimethylamino)octadecylsilane.

15. The method of claim 1, further comprising heating the substrate to a temperature of about 500 to about 1000 degrees Celsius to remove the organosilane based self-assembled monolayer.

16. The method of claim 1, wherein the metal surface is tungsten or molybdenum, or combinations thereof.

17. The method of claim 1, wherein the metal surface is copper, cobalt, or combinations thereof.

18. The method of claim 1, wherein the metal surface is tungsten, cobalt, or molybdenum, or combinations thereof.

* * * * *